(12) United States Patent
Nakagawasai et al.

(10) Patent No.: US 11,605,547 B2
(45) Date of Patent: Mar. 14, 2023

(54) TEMPERATURE MEASURING MECHANISM, TEMPERATURE MEASURING METHOD, AND STAGE DEVICE

(71) Applicant: Tokyo Electron Limited, Tokyo (JP)

(72) Inventors: Manabu Nakagawasai, Tokyo (JP); Naoyuki Suzuki, Tokyo (JP); Shinji Orimoto, Yamanashi (JP); Hiroyuki Yokohara, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 298 days.

(21) Appl. No.: 16/819,287

(22) Filed: Mar. 16, 2020

(65) Prior Publication Data
US 2020/0303223 A1    Sep. 24, 2020

(30) Foreign Application Priority Data

Mar. 18, 2019    (JP) .............................. JP2019-050482

(51) Int. Cl.
| | |
|---|---|
| H01L 21/67 | (2006.01) |
| G01K 13/00 | (2021.01) |
| H01L 21/687 | (2006.01) |

(52) U.S. Cl.
CPC ........ *H01L 21/67248* (2013.01); *G01K 13/00* (2013.01); *H01L 21/67098* (2013.01); *H01L 21/67184* (2013.01); *H01L 21/68764* (2013.01)

(58) Field of Classification Search
CPC ......... H01L 21/67248; H01L 21/67098; H01L 21/67184; H01L 21/68764
See application file for complete search history.

(56) References Cited

U.S. PATENT DOCUMENTS

| | | | | |
|---|---|---|---|---|
| 2004/0262540 | A1* | 12/2004 | Nagaseki | H01L 21/68742 250/492.1 |
| 2005/0274321 | A1* | 12/2005 | Ukei | C23C 16/4585 118/724 |
| 2007/0246192 | A1* | 10/2007 | Cunningham | H01L 21/67109 165/96 |
| 2007/0283709 | A1* | 12/2007 | Luse | H01L 21/67248 62/3.2 |
| 2007/0292598 | A1* | 12/2007 | Tada | H01L 22/10 118/712 |

(Continued)

FOREIGN PATENT DOCUMENTS

| | | |
|---|---|---|
| JP | H01-164037 A | 6/1989 |
| JP | 2004-071794 A | 3/2004 |

(Continued)

*Primary Examiner* — Nathan W Ha
(74) *Attorney, Agent, or Firm* — Venjuris, P.C.

(57) ABSTRACT

A temperature measuring device that measures a temperature of a rotatable stage that holds a substrate, includes: a contact portion provided at a position that does not hinder placing of the substrate on the stage, and a temperature detector having a temperature sensor, and provided at a position separated from the temperature detection contact portion except when measuring a temperature. When measuring the temperature of the stage, the temperature detection contact portion and the temperature detector are relatively moved and brought into contact with each other in a state where the stage is not rotating to detect the temperature of the stage.

20 Claims, 8 Drawing Sheets

(56) References Cited

U.S. PATENT DOCUMENTS

2008/0280451 A1* 11/2008 Ohmoto ............ H01L 21/67109
                                                          156/345.28
2017/0011974 A1*  1/2017 Yokawa ................ H01L 21/324
2019/0287829 A1*  9/2019 Saido ................ C23C 16/45546

FOREIGN PATENT DOCUMENTS

JP        2019-016771 A     1/2019
KR        10-0342016 B1     9/2002

* cited by examiner

TEMPERATURE MEASURING MECHANISM, TEMPERATURE MEASURING METHOD, AND STAGE DEVICE

CROSS-REFERENCE TO RELATED APPLICATIONS

This application is based on and claims priority from Japanese Patent Application No. 2019-050482 filed on Mar. 18, 2019 with the Japan Patent Office, the disclosure of which is incorporated herein in its entirety by reference.

TECHNICAL FIELD

The present disclosure relates to a temperature measuring mechanism, a temperature measuring method, and a stage device.

BACKGROUND

A processing apparatus may include a rotating stage on which a substrate such as a semiconductor wafer is placed and rotated. As a technique for measuring the temperature of the rotating stage, a technique in which a temperature sensor is embedded in a rotating stage, the output of the temperature sensor is guided to a room temperature portion through the inside of a rotation shaft, a sliding unit is provided near the center of the shaft at which the rotating peripheral speed is reduced, and the output of the sensor is transmitted to a fixed system by the sliding is disclosed in Japanese Patent Laid-Open Publication No. 01-164037.

SUMMARY

A temperature measuring mechanism according to an aspect of the present disclosure is a temperature measuring mechanism that measures a temperature of a rotatable stage on which a substrate is placed, including a temperature detection contact portion provided at a position where does not hinder placing of the substrate on the stage, and a temperature detector including a temperature sensor and provided at a position separated from the temperature detection contact portion except when measuring a temperature. When measuring the temperature of the stage, the temperature detection contact portion and the temperature detector are brought into contact with each other in a state where the stage is not rotating.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, exemplary embodiments of the present disclosure will be described in detail with reference to the drawings.

[Processing Apparatus]

Figure 1:
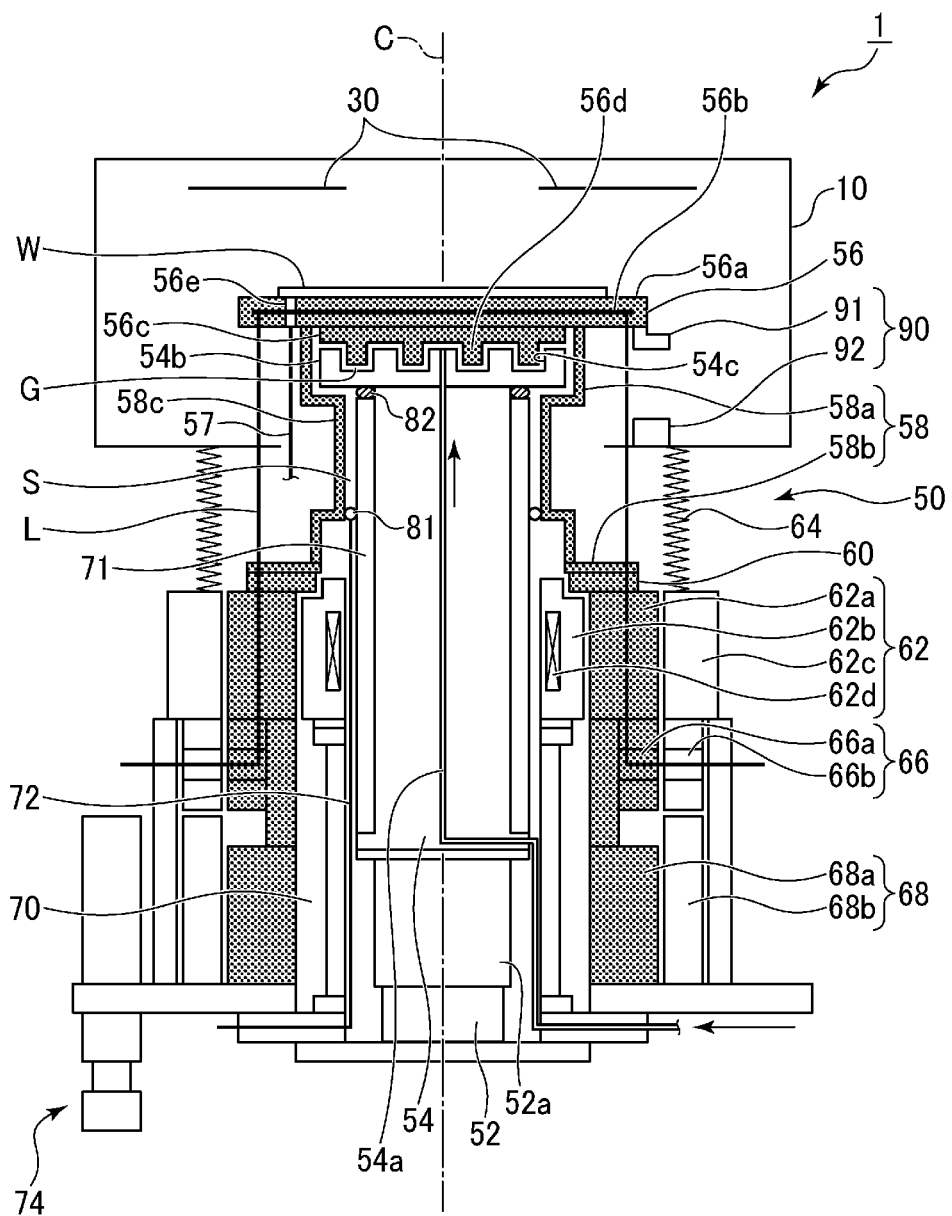
FIG. 1 is a schematic cross-sectional view illustrating an example of a processing apparatus to which a stage device including a temperature measuring mechanism according to an embodiment is applied.

First, an example of a processing apparatus to which a stage device including a temperature measuring mechanism according to an embodiment is applied will be described. FIG. 1 is a schematic cross-sectional view illustrating an example of the processing apparatus.

As illustrated in FIG. 1, the processing apparatus 1 includes a processing container 10 capable of being maintained in a vacuum, a target 30, and a stage device 50. The processing apparatus 1 is configured as a film forming apparatus capable of forming a magnetic film by sputtering on a semiconductor wafer (hereinafter, simply referred to as a "wafer") W serving as a substrate in an ultra-high vacuum and an extremely low temperature environment in the processing container 10. The magnetic film is used for, for example, a tunneling magneto resistance (TMR) element.

The processing container 10 is a processing container configured to process the wafer W serving as a substrate. The processing container 10 is connected with an exhaust unit (not illustrated) such as a vacuum pump capable of depressurizing at an ultra-high vacuum, and is configured to be able to depressurize the inside thereof to an ultra-high vacuum (e.g., $10^{-5}$ Pa or less). The processing container 10 is connected with a gas supply pipe (not illustrated) from the outside, and a sputtering gas (e.g., a rare gas such as an argon Ar gas, a krypton Kr gas, or a neon Ne gas, or a nitrogen gas) necessary for sputtering film formation is supplied from the gas supply pipe. Further, a carry-in/out port (not illustrated) for the wafer W is formed on a side wall of the processing container 10, and the carry-in/out port may be open/close by a gate valve (not illustrated).

The target 30 is provided to face above the wafer W held by the stage device 50, in an upper portion of the processing container 10. An AC voltage is applied to the target 30 from a plasma generation power source (not illustrated). When an AC voltage is applied to the target 30 from the plasma generation power source in a state where a sputtering gas is introduced into the processing container 10, plasma of the sputtering gas is generated in the processing container 10, and the target 30 is sputtered by ions in the plasma. Atoms or molecules of the sputtered target material are deposited on the surface of the wafer W held by the stage device 50. The number of targets 30 is not particularly limited, but the number of targets 30 may be plural from the viewpoint that a film of different materials may be formed by one processing apparatus 1. For example, when depositing the magnetic film (a film containing a ferromagnetic material such as Ni, Fe, or Co), for example, CoFe, FeNi, or NiFeCo may be used as a material of the target 30. Further, a material to which other elements are added to these materials may be used as the material of the target 30.

As will be described later, the stage device 50 is configured to hold the wafer W on a stage 56, rotates the stage 56 together with the wafer W, and cools the wafer W to an extremely low temperature through the stage 56. Further, as will be described later, the stage device 50 includes a lifting mechanism 74 that moves the stage 56 up and down and a temperature measuring mechanism 90 that measures the temperature of the stage.

[Stage Device]

Subsequently, the stage device 50 will be described in detail.

As illustrated in FIG. 1, the stage device 50 includes the stage 56, the lifting mechanism 74, and the temperature measuring mechanism 90. Further, the stage device 50 includes a refrigerator 52, a refrigeration heat transfer body 54, a stage support 58, a seal rotating mechanism 62, and a driving mechanism 68 as well.

The lifting mechanism 74 is configured to be capable of moving the stage 56 among a transfer position when the wafer W is placed on the stage 56, a processing position when forming a film on the wafer W placed on the stage 56, and a temperature measuring position at which the temperature of the stage is measured. The transfer position is set to a position lower than the processing position, and the temperature measuring position is set to a position lower than the transfer position. Further, it is possible to control a distance between the target 30 and the wafer W by the lifting mechanism 74.

The temperature measuring mechanism 90 includes a temperature detection contact portion 91 provided at a position where does not hinder the placing of the wafer W on the stage 56, and a temperature detector 92 provided below the stage 56. Details of the temperature measuring mechanism 90 will be described later.

The refrigerator 52 holds the refrigeration heat transfer body 54, and cools an upper surface of the refrigeration heat transfer body 54 to an extremely low temperature (e.g., −20□ or less). The refrigerator 52 has a cold head 52a at an upper portion, and cold heat is transferred from the cold head 52a to the refrigeration heat transfer body 54. The refrigerator 52 may be a type using a Gifford-McMahon (GM) cycle from the viewpoint of the cooling capability. When forming a magnetic film used for a TMR element, the cooling temperature of the refrigeration heat transfer body 54 by the refrigerator 52 may be in a range of −23□ to −223□ (250 K to 50 K).

The refrigeration heat transfer body 54 is fixedly disposed on the refrigerator 52 and forms a substantially columnar shape, and is made of a material having a high thermal conductivity such as pure copper (Cu). An upper portion of the refrigeration heat transfer body 54 is disposed in the processing container 10.

The refrigeration heat transfer body 54 is disposed below the stage 56 such that the center axis thereof coincides with the center axis C of the stage 56. A first cooling gas supply passage 54a through which a first cooling gas may flow is formed along the center axis C inside the refrigeration heat transfer body 54, and the first cooling gas is supplied from a gas supply source (not illustrated) to the first cooling gas supply passage 54a. A helium He gas having a high thermal conductivity may be used as the first cooling gas.

The stage 56 is disposed to have a gap G (e.g., 2 mm or less) formed between the stage 56 and the upper surface of the refrigeration heat transfer body 54. The stage 56 is made of a material having a high thermal conductivity such as pure copper (Cu). The gap G communicates with the first cooling gas supply passage 54a formed inside the refrigeration heat transfer body 54. Therefore, the first cooling gas at an extremely low temperature cooled by the refrigeration heat transfer body 54 is supplied to the gap G from the first cooling gas supply passage 54a. As a result, the cold heat of the refrigerator 52 is transferred to the stage 56 via the refrigeration heat transfer body 54 and the first cooling gas supplied to the gap G, and the stage 56 is cooled to an extremely low temperature (e.g., −20□ or less). A cooling medium is not limited to the first cooling gas, but other fluids having a good thermal conductivity, for example, thermal conductive grease having a good thermal conductivity may be filled in the gap G In this case, since it is not necessary to provide the first cooling gas supply passage 54a, the structure of the refrigeration heat transfer body 54 may be simplified.

The stage 56 includes an electrostatic chuck 56a. The electrostatic chuck 56a is made of a dielectric film, and has a chuck electrode 56b embedded therein. A predetermined DC voltage is applied to the chuck electrode 56b via a wiring L. As a result, the wafer W may be attracted and fixed by the electrostatic attraction force.

The stage 56 has a first heat transfer portion 56c below the electrostatic chuck 56a, and a convex portion 56d protruding toward the refrigeration heat transfer body 54 is formed on a lower surface of the first heat transfer portion 56c. In the illustrated example, the convex portion 56d is constituted by two annular portions surrounding the center axis C of the stage 56. The height of the convex portion 56d may be, for example, 40 mm to 50 mm. The width of the convex portion 56d may be, for example, 6 mm to 7 mm. The shape and the number of convex portions 56d are not particularly limited, but the shape and the number of convex portions may be set to have a surface area sufficient for heat exchange, from the viewpoint of increasing the efficiency of the heat transfer with the refrigeration heat transfer body 54.

The refrigeration heat transfer body 54 has a second heat transfer portion 54b on the upper surface of the body, that is, a surface facing the first heat transfer portion 56c. A concave portion 54c having a gap G with respect to the convex portion 56d and fitted with the convex portion is formed in the second heat transfer portion 54b. In the illustrated example, the concave portion 54c is constituted by two annular portions surrounding the center axis C of the stage 56. The height of the concave portion 54c may be the same as that of the convex portion 54d, and may be, for example, 40 mm to 50 mm. The width of the concave portion 54c may be, for example, a width slightly wider than that of the convex portion 56d, and may be, for example, 7 mm to 9 mm. The shape and the number of concave portions 54c are determined to correspond to the shape and the number of convex portions 56d.

The convex portion 56d of the first heat transfer portion 56c and the concave portion 54c of the second heat transfer portion 54b are fitted with each other via the gap G and constitute a comb tooth portion. Since the gap G is bent by providing the comb tooth portions in this manner, it is possible to increase the efficiency of the heat transfer by the first cooling gas between the first heat transfer portion 56c of the stage 56 and the second heat transfer portion 54b of the refrigeration heat transfer body 54.

Figure 2:
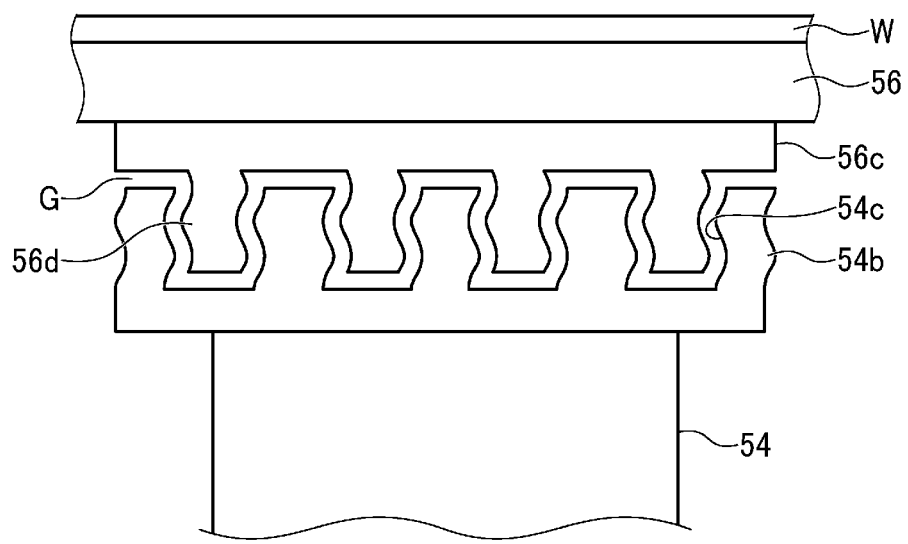
FIG. 2 is a schematic view illustrating another example of a comb tooth portion of the stage device.

As illustrated in FIG. 2, the convex portion 56d and the concave portion 54c may have a shape forming a waveform corresponding with each other, respectively. Further, the surface of the convex portion 56d and the concave portion 54c may have been subjected to an uneven processing by, for example, blasting. As a result, the surface area for heat transfer may be increased, and thus, the heat transfer efficiency may be further increased.

A concave portion may be provided in the first heat transfer portion 56c, and a convex portion corresponding to the concave portion may be provided in the second heat transfer portion 54b.

The electrostatic chuck 56a and the first heat transfer portion 56c of the stage 56 may be integrally formed, or may be separately formed and then bonded together. The body of the refrigeration heat transfer body 54 and the second heat transfer portion 54b may be integrally formed, or may be separately formed and then bonded together.

The stage 56 has a through hole 56e that penetrates vertically. The through hole 56e is connected with a second cooling gas supply passage 57, and a second cooling gas for transferring heat is supplied to the back surface of the wafer W through the through hole 56e from the second cooling gas supply passage 57. A helium He gas having a high thermal conductivity may be used as the second cooling gas, similarly to the first cooling gas. By supplying the second cooling gas to the back surface of the wafer W, that is, between the wafer W and the electrostatic chuck 56a in this manner, the cold heat of the stage 56 may be efficiently transferred to the wafer W via the second cooling gas. One through hole 56e may be provided, but a plurality of through holes may be provided, from viewpoint of transferring the cold heat of the refrigeration heat transfer body 54 to the wafer W particularly efficiently.

By separating the flowing passage of the second cooling gas supplied to the back surface of the wafer W from the flowing passage of the first cooling gas supplied to the gap G, it is possible to supply the cooling gas with a desired pressure and flow rate to the back surface of the wafer W, regardless of the supply of the first cooling gas. At the same time, it is possible to continuously supply the cooling gas in a high-pressure•extremely low temperature state to the gap G of the wafer W without being limited by the pressure, flow rate, and supply timing of the gas supplied to the back surface.

A portion of the first cooling gas may be supplied to the back surface of the wafer W as a cooling gas, by providing a through hole connected with the gap G in the stage 56.

The stage support 58 is disposed outside the refrigeration heat transfer body 54, and rotatably supports the stage 56. The stage support 58 includes a body 58a having a substantially cylindrical shape, and a flange 58b extending outward at the lower surface of the body 58a. The body 58a is disposed so as to cover the gap G and the outer peripheral surface of the upper portion of the refrigeration heat transfer body 54. As a result, the stage support 58 also has a function of blocking the gap G serving as a connecting portion of the refrigeration heat transfer body 54 and the stage 56.

The seal rotating mechanism 62 is provided below an insulating member 60. The seal rotating mechanism 62 has a rotating portion 62a, an inner fixed portion 62b, an outer fixed portion 62c, and a heater 62d.

The rotating portion 62a has a substantially cylindrical shape extending downward coaxially with the insulating member 60, and is rotated by the driving mechanism 68 in a state of being hermetically sealed by a magnetic fluid with respect to the inner fixed portion 62b and the outer fixed portion 62c. Since the rotating portion 62a is connected to the stage support 58 through the insulating member 60, the transfer of the cold heat from the stage support 58 to the rotating portion 62a is blocked by the insulating member 60. As a result, it is possible to suppress a decrease in the sealing performance or the occurrence of dew condensation due to a decrease in the temperature of the magnetic fluid of the seal rotating mechanism 62.

The inner fixed portion 62b has a substantially cylindrical shape having an inner diameter larger than the outer diameter of the refrigeration heat transfer body 54, and an outer diameter smaller than the inner diameter of the rotating portion 62a, and is provided between the refrigeration heat transfer body 54 and the rotating portion 62a via the magnetic fluid.

The outer fixed portion 62c has a substantially cylindrical shape having an inner diameter larger than the outer diameter of the rotating portion 62a, and is provided outside the rotating portion 62a via the magnetic fluid.

The heater 62d is embedded in the inner fixed portion 62b, and heats the entire seal rotating mechanism 62. As a result, it is possible to suppress a decrease in the temperature of the fluid magnetic, and a decrease in the sealing performance or the occurrence of dew condensation.

With such a configuration, the seal rotating mechanism 62 may rotate the stage support 58 in a state where a region communicating with the processing container 10 is hermetically sealed with the magnetic fluid and maintained in a vacuum.

A bellows 64 is provided between the upper surface of the outer fixed portion 62c and the lower surface of the processing container 10. The bellows 64 is a corrugated box structure made of metal that is expandable and contractible in the vertical direction. The bellows 64 surrounds the refrigeration heat transfer body 54, the stage support 58, and the insulating member 60, and separates the space in the processing container 10 and the space maintained in a vacuum and a space in the atmosphere, communicating with the space.

A slip ring 66 is provided below the seal rotating mechanism 62. The slip ring 66 includes a rotating body 66a having a metal ring, and a fixed body 66b having a brush. The rotating body 66a is fixed to the lower surface of the rotating portion 62a of the seal rotating mechanism 62, and has a substantially cylindrical shape extending downward coaxially with the rotating portion 62a. The fixed body 66b has a substantially cylindrical shape having an inner diameter slightly larger than the outer diameter of the rotating body 66a.

The slip ring 66 is electrically connected to a DC power source (not illustrated), and transfers a voltage supplied from the DC power source to the wiring L via the brush of the fixed body 66b and the metal ring of the rotating body 66a. As a result, it is possible to apply a voltage from the DC power source to the chuck electrode without causing a twist on the wiring L. The rotating body 66a of the slip ring 66 is configured to be rotated by the driving mechanism 68.

The driving mechanism 68 is a direct drive motor having a rotor 68a and a stator 68b. The rotor 68a has a substantially cylindrical shape extending coaxially with the rotating body 66a of the slip ring 66, and is fixed to the rotating body 66a. The stator 68b has a substantially cylindrical shape having an inner diameter larger than the outer diameter of the rotor 68a. When driving the driving mechanism 68, the rotor 68a is rotated, and the rotation of the rotor 68a is transferred to the stage 56 via the rotating body 66a, the rotating portion 62a, and the stage support 58, and the stage 56 and the wafer W on this stage are rotated with respect to the refrigeration heat transfer body 54. In FIG. 1, for convenience, rotating members are illustrated with dots.

A direct drive motor is illustrated as an example of the driving mechanism 68, the driving mechanism 68 may be driven via, for example, a belt.

A first insulating structure 70 forming a cylindrical shape having a double tube structure so as to cover the cold head 52a of the refrigerator 52 and the lower portion of the refrigeration heat transfer body 54, and forming a vacuum insulating structure (a vacuum double tube structure) in which the inside is in a vacuum is provided. With the first insulating structure 70, it is possible to suppress a decrease in the cooling performance due to the heat from the outside such as the driving mechanism 68 that is entered to the cold head refrigerator 52 and the lower portion of the refrigeration heat transfer body 54, which are important for cooling the stage 56 or the wafer W.

Further, a second insulating structure 71 forming a cylindrical shape having a vacuum double tube structure in which the inside is in a vacuum so as to cover the substantially entire of the refrigeration heat transfer body 54, and to overlap the inside of the first insulating structure 70. With the second insulating structure 71, it is possible to suppress a decrease in the cooling performance due to the heat from the outside such as the first cooling gas leaking into the magnetic fluid seal or the space S that is entered to the refrigeration heat transfer body 54. By overlapping the first insulating structure 70 and the second insulating structure 71 with each other in the lower portion of the refrigeration heat transfer body 54, it is possible to eliminate the uninsulated portion of the refrigeration heat transfer body 54, and to enhance the insulation in the cold head 52a and in the vicinity of the cold head.

Further, with the first insulating structure 70 and the second insulating structure 71, it is possible to suppress the cold heat of the refrigerator 52 and the refrigeration heat transfer body 54 from being transferred to the outside.

A seal member 81 is provided between the body 58a of the stage support 58 and the second insulating structure 71. The space S sealed with the seal member 81 is formed by the body 58a of the stage support 58, the second heat transfer portion 54b of the refrigeration heat transfer body 54, and the upper portion of the second insulating structure 71. The first cooling gas leaked from the gap G flows into the space S. A gas flowing passage 72 is connected to the space S through the seal member 81. The gas flowing passage 72 extends downward from the space S. A space between the upper surface of the second insulating structure 71 and the second heat transfer portion 54b of the refrigeration heat transfer body 54 is sealed by a seal member 82. The first cooling gas leaking to the space S is suppressed from being supplied to the body of the refrigeration heat transfer body 54 by the seal member 82.

The gas flowing passage 72 may discharge a gas in the space S, or may supply the cooling gas to the space S. In both cases where the gas flowing passage 72 discharges the gas and where the gas flowing passage supplies the cooling gas, it is possible to prevent a decrease in the seal performance due to penetration of the first cooling gas into the seal rotating mechanism 62, and thus a decrease in the temperature of the magnetic fluid. When the gas flowing passage 72 has a cooling gas supply function, a third cooling gas is supplied to function as a counter flow with respect to the first cooling gas leaked from the gap G From the viewpoint of enhancing the function as the counter flow, the supply pressure of the third cooling gas may be substantially the same as or slightly higher than the supply pressure of the first cooling gas. Due condensation may be prevented by using a gas having a thermal conductivity lower than that of the first cooling gas, such as an argon Ar gas or a neon Ne gas as the third cooling gas.

[Temperature Measuring Mechanism]

Subsequently, the temperature measuring mechanism 90 will be described in detail.

Figure 3:
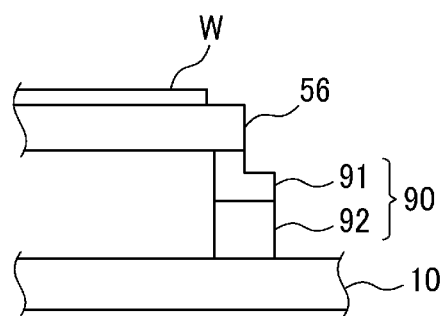
FIG. 3 is a cross-sectional view schematically illustrating a state of measuring a temperature by the temperature measuring mechanism.

As described above, the temperature measuring mechanism 90 includes a portion of the stage 56 that is a temperature measurement target other than the placing surface for the wafer W, in the present example, the temperature detection contact portion 91 provided on the outer peripheral portion of the stage 56, and the temperature detector 92 provided below the stage 56. The temperature detector 92 has a temperature sensor, and provided at a position separated from the temperature detection contact portion 91 except when measuring the temperature. In the present example, the temperature detector 92 is attached to the bottom of the processing container 10. The temperature of the stage 56 may be measured by bringing the temperature detector 92 into contact with the temperature detection contact portion 91. The temperature detection contact portion 91 is configured to be connectable to and separable from the temperature detector 92 by moving the stage 56 up and down by the lifting mechanism 74. Then, as illustrated in FIG. 3, the temperature detection contact portion 91 and the temperature detector 92 are corresponded with each other by rotating the stage 56, and the temperature detection contact portion 91 is brought into contact with the temperature detector 92 by moving down the stage 56 to the temperature measuring position. In this stage, the temperature of the stage 56 is measured.

The stage 56 is rotated in a state of being moved up to the processing position above the temperature measuring position, and the film forming processing is performed. At this time, since the temperature detector 92 is separated from the temperature detection contact portion 91, the temperature is not measured.

Subsequently, the temperature detection contact portion 91 will be described in detail.

Figure 4:
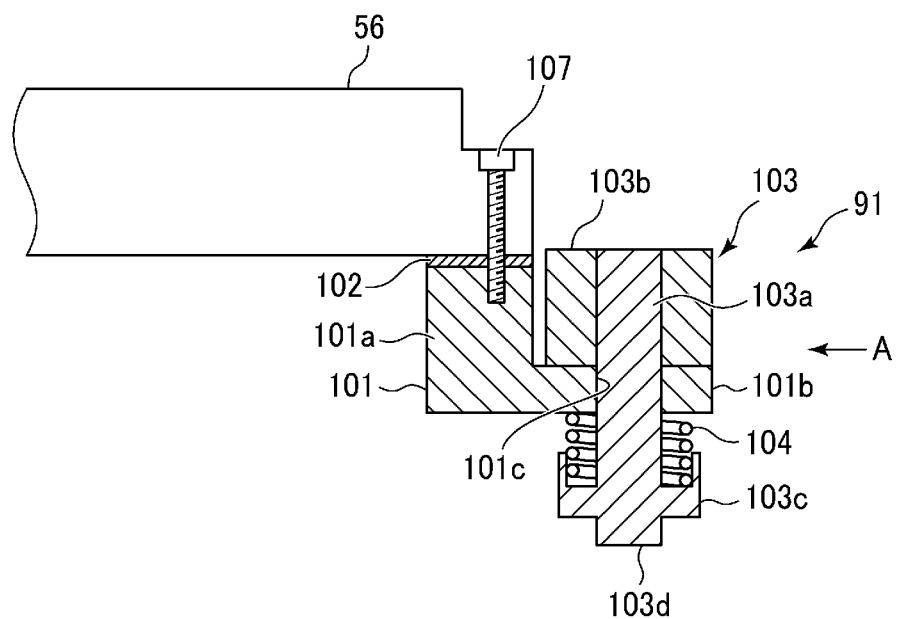
FIG. 4 is a cross-sectional view illustrating a temperature detection contact portion of the temperature measuring mechanism.
Figure 5:
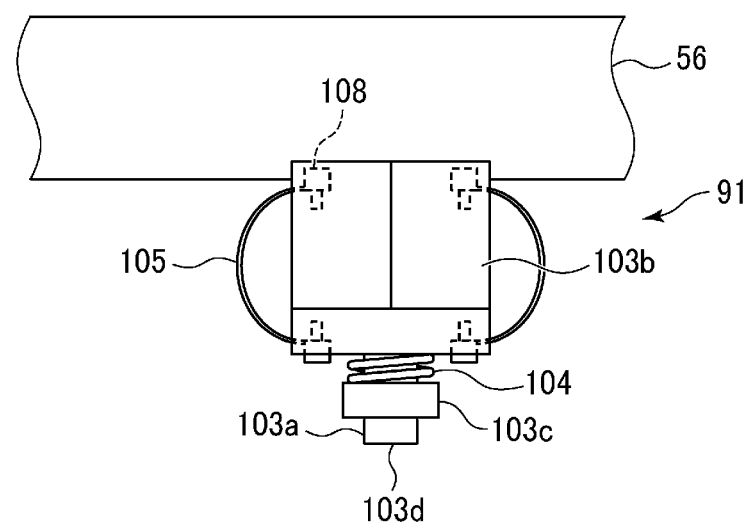
FIG. 5 is a side view of the temperature detection contact portion in FIG. 4 as viewed from an arrow A.

FIG. 4 is a cross-sectional view illustrating the temperature detection contact portion 91, and FIG. 5 is a side view of the temperature detection contact portion 91 in FIG. 4 as viewed from an arrow A.

The temperature detection contact portion 91 includes a bracket (connecting member) 101, an indium sheet 102, a heat transfer member 103, a coil spring (spring member) 104, and a leaf spring 105.

The bracket 101 is made of a material having a high thermal conductivity similarly to the stage 56, for example, pure copper (Cu), and is connected to the lower surface of the outer peripheral portion of the stage 56 by screws 107 via the indium sheet 102. The bracket 101 has a vertical portion 101a extending downward from the stage 56, and a horizontal portion 101b extending outward horizontally with respect to the stage 56 at the lower end of the vertical portion 101a. Since the indium sheet 102 is soft and has a high thermal conductivity, the heat transfer capability from the stage 56 to the bracket 101 may be improved, and a temperature measurement error may be extremely reduced.

The heat transfer member 103 is configured to transfer the cold heat of the stage 56 transferred via the bracket 101 to the temperature detector 92, and is made of a material having a high thermal conductivity, for example, pure copper (Cu). The heat transfer member 103 has a body 103a that has a rod shape and is vertically inserted into a hole 101c provided in the horizontal portion of the bracket 101. Further, the heat transfer member 103 has a head 103b that is attached to a portion of the body 103a extending upward from the horizontal portion 101b of the bracket 101. An engaging portion 103c configured to engage the coil spring 104 is formed at the lower end of the body 103a. A bottom surface 103d of the heat transfer member 103 is serving as a pressing surface that presses the upper surface of the temperature detector 92.

The coil spring 104 is provided between the lower surface of the horizontal portion 101b of the bracket 101 and the engaging portion 103a of the heat transfer member 103, and bias the heat transfer member 103 downward. The coil spring 104 is formed of a material that is usable at an extremely low temperature, for example, a nickel-based alloy such as Inconel or Elgiloy. When measuring the temperature, the heat transfer member 103 is moved down together with the stage 56, and the bottom surface 103d is pressed against the temperature detector 92 against the biasing force of the coil spring 104.

When not measuring the temperature, the lower surface of the head 103b is in contact with the horizontal portion 101b of the bracket 101 by the biasing force of the coil spring 104. As a result, the heat of the stage 56 is transferred to the heat transfer member 103 via the indium sheet 102 and the bracket 101. The head 103b may be integrally formed with the body 103a.

From the viewpoint of measuring more accurate temperature at an extremely low temperature, all of the stage 56, the bracket 101, and the heat transfer member 103 may be made of pure copper (Cu) having an extremely good thermal conductivity at an extremely low temperature.

Meanwhile, when measuring the temperature, the heat transfer member 103 is moved down together with the stage 56, and the bottom surface 103d of the heat transfer member 103 is pressed against the temperature detector 92 against the biasing force of the coil spring 104. At this time, the head 103b and the horizontal portion 101b of the bracket 101 are separated from each other.

The leaf spring 105 is fixed to the upper end of the head 103b and the lower end of the horizontal portion 101b of the bracket 101 by screws 108, and has a function of preventing the heat transfer member 103 from being loosed.

Subsequently, the temperature detector 92 will be described in detail.

Figure 6:
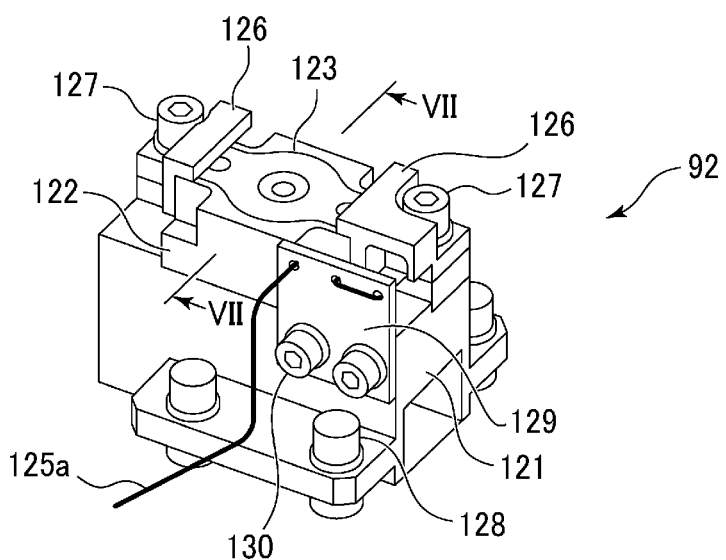
FIG. 6 is a perspective view illustrating a temperature detector of the temperature measuring mechanism.
Figure 7:
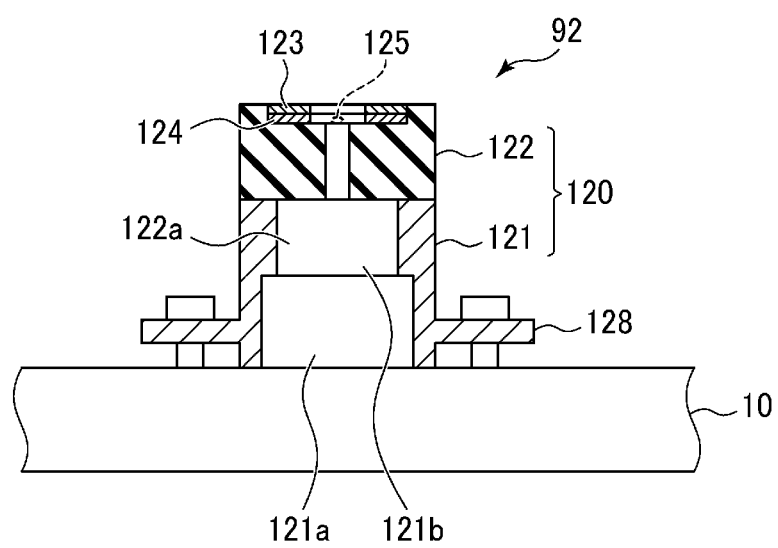
FIG. 7 is a cross-sectional view taken along a plane corresponding to line VII-VII in FIG. 6.
Figure 8:
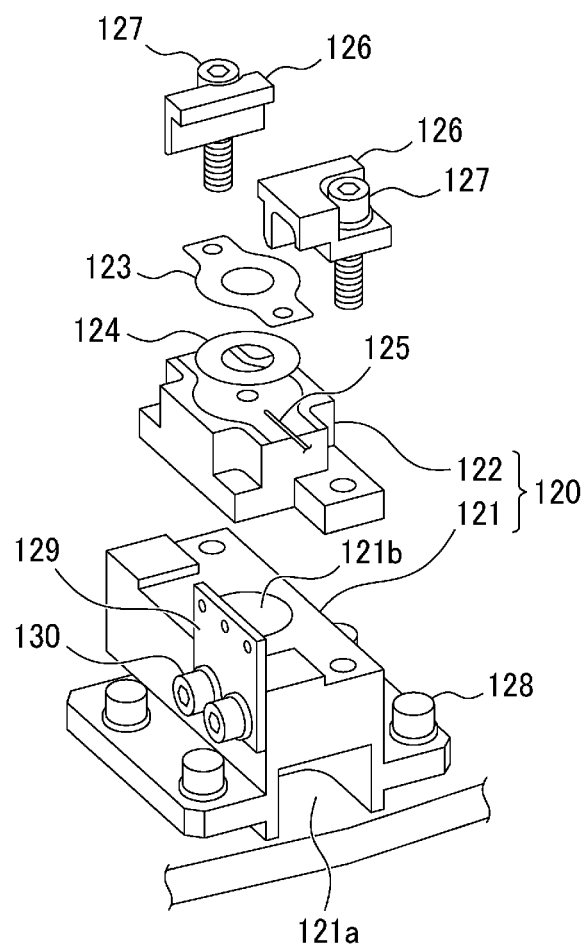
FIG. 8 is an exploded perspective view of the temperature detector.
Figure 9:
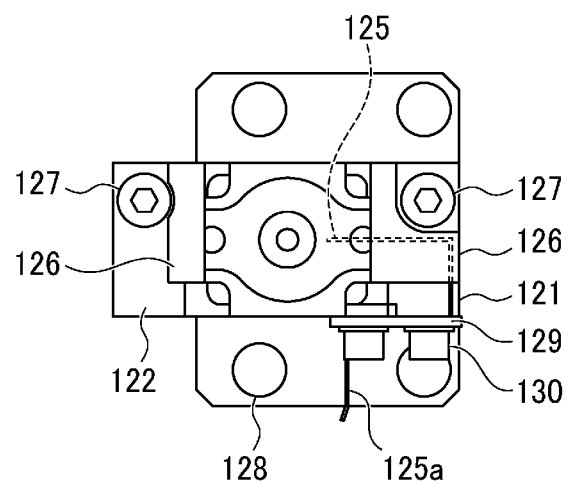
FIG. 9 is a plan view illustrating an attached state of a sheath thermocouple of the temperature detector.

FIG. 6 is a perspective view illustrating the temperature detector 92, FIG. 7 is a cross-sectional view taken along a plane corresponding to line VII-VII in FIG. 6, FIG. 8 is an exploded perspective view of the temperature detector 92, and FIG. 9 is a plan view illustrating an attached state of a sheath thermocouple 125 of the temperature detector 92.

The temperature detector 92 includes a base member 120 constituted by a metal member 121 such as aluminum, and a resin member 122 provided on the metal member, and made of a resin material such as PTFE, and the sheath thermocouple 125 serving as a temperature sensor. The resin member 122 functions as an insulating member, and the sheath thermocouple 125 is disposed on the upper surface of the resin member. The metal member 121 is fixed to the bottom of the processing container 10 by screws 128. The base member 120 may have only a resin member. Further, the temperature detector 92 further includes a heat collecting plate 123 and an indium sheet 124.

The indium sheet 124 is disposed on the upper surface of the resin member 122 where the sheath thermocouple 125 is disposed so as to cover the sheath thermocouple 125. The indium sheet 124 has a thin plate shape with a thickness of, for example, 0.3 mm, and has a function of improving thermal responsiveness.

The heat collecting plate 123 is disposed on the upper surface of the indium sheet 124 in a region where the sheath thermocouple 125 is disposed. The heat collecting plate 123 is made of a material having a good thermal conductivity, and for example, at least the body thereof is made of pure copper (Cu). A high thermal conductivity in an extremely low temperature region is obtained by forming the heat collecting plate 123 with Cu, and additionally, the heat capacity may be reduced by forming the heat collecting plate as a thin plate shape. Further, it is possible to suppress the fluctuation when measuring the temperature by the sheath thermocouple 125, by providing the heat collecting plate 123. The heat collecting plate 123 has a thin plate shape having a thickness of, for example, 0.1 mm From the viewpoint of preventing corrosion of the heat collecting plate 123, a corrosion-resistant coating, for example, nickel Ni plating with a thickness of about 5 μm may be applied to the body made of pure copper (Cu). At this time, from the viewpoint of the responsiveness of the temperature measurement, the contact portion of the sheath thermocouple 125 may expose pure copper without being plated.

When measuring the temperature, the heat transfer member 103 (the bottom surface 103d) of the temperature detection contact portion 91 is pressed against the region where the sheath thermocouple 125 is disposed, and the temperature is measured.

Figure 10:
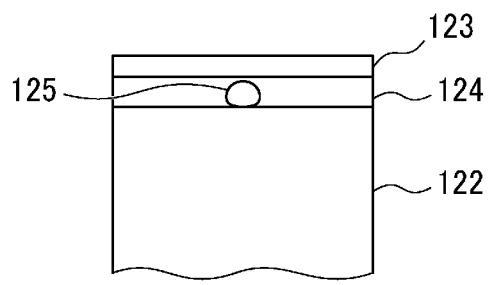
FIG. 10 is a schematic cross-sectional view for explaining a state of the sheath thermocouple in the temperature detector.

Holding members 126 that hold the heat collecting plate 123 are disposed on the upper surface of both ends of the heat collecting plate 123, and the holding members 126 and the resin member 122 are screwed to the metal member 121 by screws 127 that penetrate these members. The heat collecting plate 123 and the indium sheet 124 are pressed against each other by the holding members 126, by screwing by the screws 127. As a result, as illustrated in FIG. 10, the sheath thermocouple 125 is embedded in the indium sheet 124 that is soft and has a high thermal conductivity, and thus, the temperature detection by the sheath thermocouple 125 may be performed with high accuracy.

A groove 121a is provided at the lower portion of the metal member 121, and a cylindrical hollow 121b that penetrates vertically is provided at the central portion of the metal member. Further, the resin member 122 is also provided with a hollow 122a that penetrates vertically. As a result, in addition to insulate the heat from the processing container 10 by the resin member 122, it is possible to reduce the heat capacity by the vacuum insulating by the groove 121a and the hollows 121b and 122a.

The sheath thermocouple 125 has a structure in which a thermocouple, for example, a k-type thermocouple (aluminum chromel) is covered with a metal tube via an insulating member. It is advantageous when the sheath thermocouple 125 is thinner from the viewpoint of improving the responsiveness and shortening the temperature measuring time, and for example, the diameter thereof may be 0.3 mm to 1.0 mm A wiring 125a of the sheath thermocouple 125 extends from a measurement unit outside the processing container 10, is inserted into the processing container 10 via an introducing port, and is guided by a plurality of insulating tubes and is drawn to the temperature detector 92 at the bottom of the processing container. It is possible to minimize the influence of heat by being guided by the insulating tubes. A hermetic seal may be used for the introduction port.

Further, the temperature detector 92 further includes a wiring relay panel 129 attached to the metal member 121 by screws 130. The wiring relay panel 129 is configured to relay the wiring 125a of the sheath thermocouple 125, and the wiring 125a reaches the upper surface of the resin member 122 through the wiring relay panel 129 and is connected to the thermocouple 125.

[Operation of Processing Apparatus and Temperature Measuring Method by Temperature Measuring Mechanism]

In the processing apparatus 1, the inside of the processing container 10 becomes a vacuum, and the refrigerator 52 of the stage device 50 is operated. Further, the first cooling gas is supplied to the gap G through the first cooling gas flowing passage 54a. As a result, the cold heat transferred from the refrigerator 52 maintained at an extremely low temperature to the refrigeration heat transfer body is transferred to the stage 56 via the first cooling gas supplied to the gap G, and the state 56 provided rotatably is maintained at an extremely low temperature of −20□ or less.

Then, the stage device 50 is moved (moved down) by the lifting mechanism 74 such that the stage 56 is at the transfer position, and the wafer W is transferred from the vacuum transfer chamber by the transfer device (neither is illustrated), into the processing container 10, and is placed on the stage 56. Subsequently, a DC voltage is applied to the chuck electrode 56b, and the wafer W is electrostatically attracted by the electrostatic chuck 56a. Then, the second cooling gas is supplied to the back surface of the wafer W, and the wafer W is also maintained at an extremely low temperature of −20□ similarly to the stage 56.

After that, the stage 56 is moved up to the processing position, and the film forming processing is performed while rotating the stage 56 maintained at an extremely low temperature. However, in the present embodiment, prior to the film forming processing, the temperature of the stage 56 is measured before rotating the stage 56.

Figure 11:
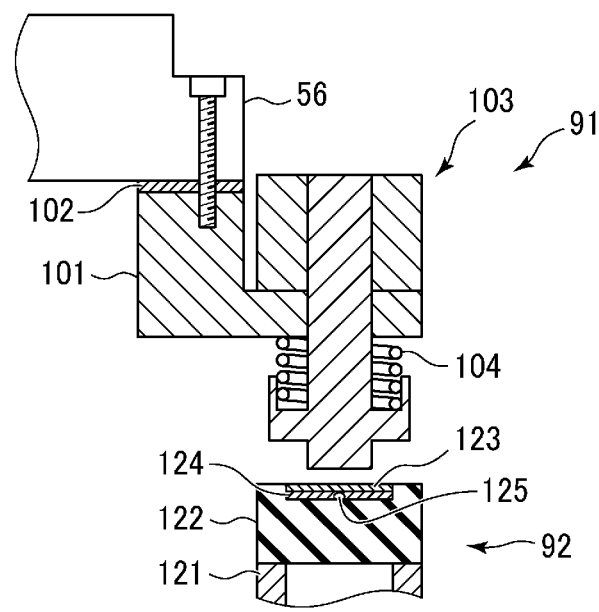
FIG. 11 is a view illustrating a positional relationship between the temperature detection contact portion and the temperature detector when the stage is positioned at a temperature measuring position.

When measuring the temperature of the stage 56, the stage 56 is positioned at the temperature measuring position lower than the transfer position by the lifting mechanism 74. In this state, the stage 56 is positioned such that the height position of the temperature detection contact portion 91 and the height position of the temperature detector 92 are separated from each other by about several mm, and as illustrated in FIG. 11, the stage 56 is rotated in this state to adjust the position of the temperature detection contact portion 91 to the position of the temperature detector 92.

Figure 12:
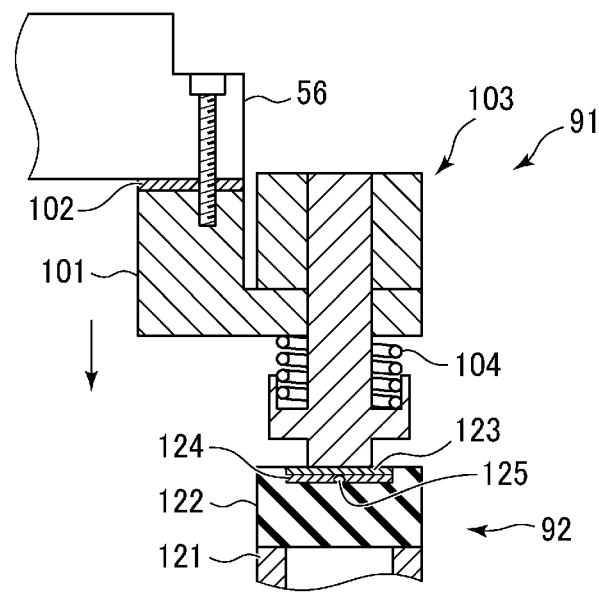
FIG. 12 is a view illustrating a state where the stage is further moved down from the temperature measuring position, and the temperature detection contact portion and the temperature detector are brought into contact with each other.
Figure 13:
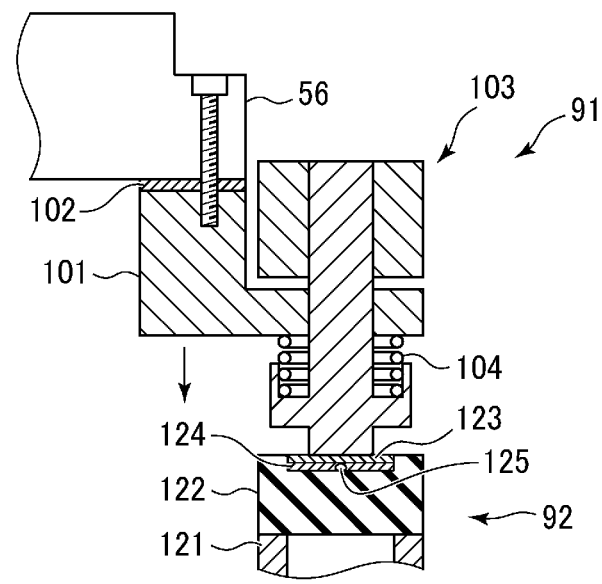
FIG. 13 is a view illustrating a state where the stage is further moved down from the state in FIG. 12, and the temperature detection contact portion and the temperature detector are in a position at which the temperature is actually measured.

After finishing the positioning of the temperature detection contact portion 91 and the temperature detector 92, the stage 56 is moved down by several mm from the temperature measuring position, and as illustrated in FIG. 12, the lower end of the temperature detection contact portion 91, that is, the bottom surface 103d of the heat transfer member 103 is brought into contact with the upper surface (i.e., heat collecting plate 123) of the temperature detector 92. Then, by further moving the stage 56 down by several mm, as illustrated in FIG. 13, the bottom surface 103d of the heat transfer member 103 presses the upper surface (i.e., heat collecting plate 123) of the temperature detector 92. In this stage, although depending on the attained temperature, the temperature of the stage 56 is measured by the sheath thermocouple 125, by holding for about 1 sec to 30 sec (detecting time). The detecting time at this time depends on the responsiveness (sensitivity) of the sheath thermocouple 125, and the smaller the diameter of the sheath thermocouple 125, the higher the responsiveness (sensitivity), and thus, the detecting time may be shortened. When the diameter of the sheath thermocouple 125 is 0.3 mm, the temperature may be detected almost accurately by holding the sheath thermocouple for about 2 sec.

In the related art, temperature measurement of a rotating stage is performed by measuring the temperature via a sliding member while the stage is rotating as disclosed in Japanese Patent Laid-Open Publication No. 01-164037. However, in this temperature measuring, a measurement error increases due to the measurement via the sliding member, and it is difficult to measure stably due to, for example, wear or the sliding member.

With respect to the above, in the present embodiment, the temperature detector 92 is provided separately from the stage 56, and the temperature is measured by bringing the temperature detection contact portion 91 provided in the stage 56 into contact with the temperature detector 92 while the stage 56 is rotated. As a result, since the temperature is measured without using a sliding member, it is possible to measure the temperature stably and with high accuracy, without causing a temperature error or instability of the temperature measurement. Further, it is possible to measure the temperature of the stage 56 at an arbitrary timing at which the stage 56 is not rotated by moving the stage 56 up and down, and when performing the measurement immediately before the film forming processing in which the stage 56 is rotated, the temperature substantially the same as when the stage is rotating may be detected.

Further, when the temperature detector is in contact with the stage via a sliding member as in the related art, in the temperature measurement of the stage in an extremely low temperature as in the present embodiment, it may be difficult to maintain the stage at an extremely low temperature due to the heat entered from the temperature detector.

With respect to the above, in the present embodiment, the temperature detection contact portion 91 and the temperature detector 92 are brought into contact with each other only when measuring the temperature, and thus, the heat entered to the stage 56 is essentially small. Further, even during the temperature measurement, it is possible to prevent the heat from entering to the stage 56 extremely effectively and to measure the temperature with extremely high accuracy.

Hereinafter, descriptions will be made in detail with respect to this aspect.

The temperature detection contact portion 91 has the bracket 101 and the heat transfer member 103 which are important components, made of a material having a good thermal conductivity, for example, pure copper (Cu), similarly to the stage 56. Further, the indium sheet 102 that has a good thermal conductivity and is soft is provided between the stage 56 and the bracket 101. As a result, in the state in FIG. 11, a good thermal conductivity is maintained between the stage 56 to the bracket 101, and additionally, the presence of the head 103b allows that the cold heat from the stage 56 is sufficiently transferred to the heat transfer member 103 via the bracket 101. In particular, in the case of pure copper (Cu), the heat conductivity at an extremely low temperature is extremely high, and the heat transfer property to the heat transfer member 103 is extremely high. Therefore, in the heat transfer member 103 that is in contact with the temperature detector 92, the temperature of the bottom surface 103d of the heat transfer member 103 that is in contact with the temperature detector 92 is substantially the same as the temperature of the stage 56. Meanwhile, when the bottom surface 103d of the heat transfer member 103 is in contact with the temperature detector 92 at the time of temperature measurement, and the heat transfer member 103 presses the temperature detector 92, as illustrated in FIG. 13, the head 103b is moved up, and thus, the heat from the temperature detector 92 is blocked between the head 103b and the bracket 101. Since the heat transfer member 103 and the stage 56 are maintained substantially the same temperature immediately after being blocked, the temperature may be measured with high accuracy. Additionally, the heat from the temperature detector 92 to the stage 56 is blocked, and thus, there is almost no thermal effect on the stage 56.

Further, the temperature detector 92 is fixed to the bottom of the processing container 10, the sheath thermocouple 125 for detecting the temperature is maintained above the resin member 122 having a high insulating effect. Further, the metal member 121 and the resin member 122 are provided with a space such as a hollow to be vacuum insulated. As a result, the heat capacity may be small, and the thermal effect on the sheath thermocouple 125 may be reduced. The heat collecting plate 123 made of, for example, pure copper (Cu) is disposed on the sheath thermocouple 125 via the indium sheet 124, and the sheath thermocouple 125 is buried in the indium sheet 124. As a result, when measuring the temperature by bringing the heat transfer member 103 of the temperature detection contact portion 91 into contact with the heat collecting plate 123, it is possible to perform the temperature detection by the sheath thermocouple 125 with high accuracy.

After measuring the temperature of the stage 56, the stage 56 is moved (moved up) to the processing position by the lifting mechanism 74, and the inside of the processing container 10 is adjusted to an ultra-high vacuum (e.g., $10^{-5}$ Pa or less) that is the processing pressure. Then, the rotation of the rotor 68a is transferred to the stage 56 via the rotating body 66a, the rotating portion 62a, and the stage support 58 by providing the driving mechanism 68, and the stage 56 and the wafer W on the stage are rotated with respect to the refrigeration heat transfer body 54.

At this time, in the stage device 50, since the stage 56 is separated from the refrigeration heat transfer body 54 fixedly provided, the stage 56 may be rotated by the driving mechanism 68 via the stage support 58. Further, the cold heat transferred from the refrigerator 52 maintained at an extremely low temperature to the refrigeration heat transfer body 54 is transferred to the stage 56 via the first cooling gas supplied to the narrow gap G of 2 mm or less. Then, the wafer W may be efficiently cooled by the cold heat of the stage 56, by attracting the wafer W by the electrostatic chuck 56a while supplying the second cooling gas to the back surface of the wafer W. As a result, the wafer W may be rotated together with the stage 56, while maintaining the wafer W at for example, an extremely low temperature of −20□ or less.

In this manner, a voltage is applied to the target 30 from a plasma generation power source (not illustrated) while introducing a sputtering gas into the processing container 10 in a state where the wafer W is being rotated. As a result, a plasma of the sputtering gas is generated, and the target 30 is sputtered by ions in the plasma. Atoms or molecules of the sputtered target material are deposited on the surface of the wafer W held by the stage device 50 at an extremely low temperature, and a desired film, for example, a magnetic film for a TMR element having a high magneto resistance ratio may be formed.

The temperature measurement timing by the temperature measuring mechanism 90 is not limited to the timing immediately before performing the film forming processing described above, and the temperature may be measured at an arbitrary timing as long as the stage 56 is stopped. For example, the temperature of the stage 56 before the wafer W is placed may be measured, and the temperature of the stage immediately after the film forming processing may be measured.

[Other Applications]

For example, in the above embodiment, the case in which the stage 56 is maintained at an extremely low temperature (−20□ or less), and the magnetic film used for a TMR element is applied to the sputtering film formation has been described as an example. However, as long as the processing is performed while rotating the stage, the temperature of the stage or the contents of the processing are not limited thereto.

Further, in the above embodiment, the example in which the temperature detection contact portion is moved up and down together with the stage to connect to and separate from the temperature detector has been described. However, the temperature detector may be moved up and down. The position of the temperature detection contact portion is also not limited to the position in the above embodiment, and may be a position where does not hinder the placing of the substrate on the stage.

In the above embodiment, the temperature measuring mechanism provided with one temperature detection contact portion and one temperature detector is illustrated. However, the present disclosure is not limited thereto, and a plurality of temperature detection contact portions and temperature detectors may be provided. It is possible to measure the temperature of the stage at a plurality of locations, and to grasp the temperature distribution of the stage, by providing a plurality of temperature detection contact portions and temperature detectors.

According to the present disclosure, a temperature measuring mechanism, a temperature measuring method, and a stage device capable of stably measuring the temperature of a rotating stage with high accuracy is provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A temperature measuring device that measures a temperature of a rotatable stage configured to hold a substrate, the device comprising:

a contact portion provided at a position that does not hinder placing of the substrate on the stage and configured to measure the temperature of the stage, and a temperature detector including a temperature sensor and provided at a position separated from the contact portion except when measuring a temperature, wherein, when measuring the temperature of the stage, the contact portion and the temperature detector are relatively moved and brought into direct contact with each other to detect the temperature of the stage in a state where the stage is not rotating.

2. The temperature measuring device according to claim 1, wherein the stage is provided to be movable in an up and down direction in a processing container in which a predetermined processing is performed on the substrate, the temperature detector is provided at a bottom portion of the processing container, and the stage is rotated such that the contact portion corresponds to the temperature detector, and the stage is then moved down such that the contact portion and the temperature detector are brought into contact with each other, thereby detecting the temperature of the stage.

3. The temperature measuring device according to claim 2, wherein the contact portion includes a heat transfer plate that is brought into contact with the temperature detector when measuring a temperature and transfers heat of the stage to the temperature detector, and a spring that bias the heat transfer plate toward a side of the temperature detector, the temperature detector includes a sheath thermocouple serving as the temperature sensor, and a base having an insulating member in which the sheath thermocouple is disposed, and when measuring the temperature of the stage, the heat transfer plate is pressed against a region of the temperature detector where the sheath thermocouple is disposed, against a biasing force of the spring.

4. The temperature measuring device according to claim 3, wherein the stage is maintained at a temperature of −20° C. or less, the contact portion further includes a connector that is connected to the stage, the heat transfer plate is inserted into the connector so as to be movable in an up and down direction, and includes a head that is brought into contact with the connector by the biasing force of the spring, and when the heat transfer plate is pressed against the temperature detector, the head is separated from the connector.

5. The temperature measuring device according to claim 4, wherein the stage, the connector, and the heat transfer plate are made of a pure copper.

6. The temperature measuring device according to claim 5, wherein the contact portion further includes an indium sheet provided between the stage and the connector.

7. The temperature measuring device according to claim 4, wherein the temperature detector includes a heat collecting plate provided on a region of the insulating member where the sheath thermocouple is disposed, and having at least a main body made of a pure copper.

8. The temperature measuring device according to claim 7, wherein a surface of the main body of the heat collecting plate is plated with nickel.

9. The temperature measuring device according to claim 7, wherein the temperature detector further includes an indium sheet provided to cover the sheath thermocouple below the heat collecting plate, in a region where the sheath thermocouple is disposed.

10. A method of measuring a temperature of a rotatable stage configured to hold a substrate, using a temperature measuring device including:

a contact portion provided at a position that does not hinder placing of the substrate on the stage; and a temperature detector including a temperature sensor and provided at a position separated from the contact portion except when measuring a temperature, the method comprising:

bringing the stage into a non-rotating state; and relatively moving the contact portion and the temperature detector to be brought into direct contact with each other to detect the temperature of the stage in a state where the stage is not rotating.

11. The method according to claim 10, wherein, in the temperature measuring device, the stage is provided to be movable in an up and down direction in a processing container in which a predetermined processing is performed on the substrate, and the temperature detector is provided at a bottom portion of the processing container, and the method further comprising:

before the relatively moving, rotating the stage such that the contact portion corresponds to the temperature detector, wherein, in the relatively moving, the stage is moved down in a state where the contact portion corresponds to the temperature detector, so that the contact portion and the temperature detector are brought into contact with each other.

12. The method according to claim 11, wherein the contact portion includes a heat transfer plate that is brought into contact with the temperature detector when measuring a temperature and transfers heat of the stage to the temperature detector, and a spring that bias the heat transfer plate toward a side of the temperature detector, the temperature detector includes a sheath thermocouple serving as the temperature sensor, and a base having an insulating member in which the sheath thermocouple is disposed, and in the relatively moving, the heat transfer plate is pressed against a region of the temperature detector where the sheath thermocouple is disposed, against a biasing force of the spring.

13. The method according to claim 12, wherein the stage is maintained at a temperature of −20° C. or less, the contact portion further includes a connector that is connected to the stage, the heat transfer plate includes a head that is inserted into the connector so as to be movable in an up and down direction, and is brought into contact with the connector by the biasing force of the spring, and during the relatively moving, the heat transfer plate is pressed against the temperature detector, so that the head is separated from the connector.

14. A stage device comprising:

a stage that holds a substrate in a processing container maintained in a vacuum;

a contact portion provided at a position that does not hinder placing of the substrate on the stage;

a temperature detector including a temperature sensor and provided at a bottom portion of the processing container;

a rotator that rotates the stage; and a lift that moves the stage in an up and down direction, wherein the stage is rotated such that the contact portion corresponds to the temperature detector, and the stage is then moved down such that the contact portion and the temperature detector are brought into contact with each other in a state where the stage is not rotated, thereby measuring a temperature of the stage.

15. The stage device according to claim 14, wherein the contact portion includes a heat transfer plate that is brought into contact with the temperature detector when measuring a temperature and transfers heat of the stage to the temperature detector, and a spring that bias the heat transfer plate toward a side of the temperature detector, the temperature detector includes a sheath thermocouple serving as the temperature sensor, and a base having an insulating member in which the sheath thermocouple is disposed, and when measuring the temperature of the stage, the heat transfer plate is pressed against a region of the temperature detector where the sheath thermocouple is disposed, against a biasing force of the spring.

16. The stage device according to claim 15, further comprising:

a refrigeration heat transfer body that is fixedly disposed on a back side of the stage via a gap and is cooled to a predetermined temperature by a refrigerator; and a cooling fluid that is supplied to the gap, and transfers cold heat of the refrigeration heat transfer body to the stage, wherein the contact portion further includes a connector that is connected to the stage, the heat transfer plate includes a head that is inserted into the connecting member so as to be movable in an up and down direction, and is brought into contact with the connector by the biasing force of the spring, and when the heat transfer member is pressed against the temperature detector, the head is separated from the connector.

17. The stage device according to claim 16, wherein the stage, the connector, and the heat transfer plate are made of a pure copper.

18. The stage device according to claim 16, wherein the contact portion further includes an indium sheet provided between the stage and the connector.

19. The stage device according to claim 16, wherein the temperature detector includes a heat collecting plate provided on a region of the insulating member where the sheath thermocouple is disposed, and having at least a main body made of a pure copper.

20. The stage device according to claim 19, wherein the temperature detector further includes an indium sheet provided to cover the sheath thermocouple below the heat collecting plate, in a region where the sheath thermocouple is disposed.

* * * * *